(12) United States Patent
Tsei et al.

(10) Patent No.: US 6,479,403 B1
(45) Date of Patent: Nov. 12, 2002

(54) METHOD TO PATTERN POLYSILICON GATES WITH HIGH-K MATERIAL GATE DIELECTRIC

(75) Inventors: Ming-Huan Tsei, Jubei (TW); Hun-Jan Tao, Hsinchu (TW); Baw-Ching Perng, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/085,718

(22) Filed: Feb. 28, 2002

(51) Int. Cl.7 .................... H01L 21/3205; H01L 21/336
(52) U.S. Cl. ...................... 438/778; 438/785; 438/287; 438/585
(58) Field of Search ................................ 438/216, 785, 438/778, 149, 287, 585

(56) References Cited

U.S. PATENT DOCUMENTS

| 5,783,479 A | 7/1998 | Lin et al. ..................... 438/592 |
| 6,063,698 A | 5/2000 | Tseng et al. ................. 438/585 |
| 6,255,221 B1 | 7/2001 | Hudson et al. ............. 438/710 |
| 6,271,094 B1 | 8/2001 | Boyd et al. ................. 438/287 |

*Primary Examiner*—Richard Elms
*Assistant Examiner*—Beth E. Owens
(74) *Attorney, Agent, or Firm*—George O. Saile; Stephen B. Ackerman; Stephen G. Stanton

(57) ABSTRACT

A method of patterning a gate electrode layer having an underlying high-k dielectric layer comprising the following sequential steps. A substrate is provided. A high-k dielectric layer is formed over the substrate. A gate electrode layer is formed over the high-k dielectric layer. The gate electrode layer is patterned to form a patterned gate electrode layer, the patterned gate electrode layer having exposed side walls and a top. Sidewall spacers are formed over the exposed side walls of the patterned gate electrode layer, the sidewall spacers having tops. The patterned gate electrode layer is etched to pull the top of the patterned gate electrode layer down from the tops of the sidewall spacers. The exposed portions of the high-k dielectric layer not under the sidewall spacers and the pulled-down patterned gate electrode layer are removed.

50 Claims, 2 Drawing Sheets

METHOD TO PATTERN POLYSILICON GATES WITH HIGH-K MATERIAL GATE DIELECTRIC

BACKGROUND OF THE INVENTION

During fabrication of gate electrodes, wet approaches to remove/pattern high-k gate dielectrics almost invariably induces unwanted side effect and dry approaches cause loss of the gate spacers which induces subsequent silicide shorting problems.

U.S. Pat. No. 6,271,094 B1 to Boyd et al. describes a high-k gate oxide and gate process.

U.S. Pat. No. 6,063,698 to Tseng et al. describes another high-k gate oxide and gate process.

U.S. Pat. No. 5,783,479 to Lin et al. describes a structure and method for manufacturing FETs having T-shaped gates.

U.S. Pat. No. 6,255,221 B1 to Hudson et al. describes methods and systems for etching dielectric layers in a high density plasma etcher.

SUMMARY OF THE INVENTION

Accordingly, it is an object of one or more embodiments of the present invention to provide an improved method of patterning gate electrodes having an underlying high-k gate dielectric layer.

Other objects will appear hereinafter.

It has now been discovered that the above and other objects of the present invention may be accomplished in the following manner. Specifically, a substrate is provided. A high-k dielectric layer is formed over the substrate. A gate electrode layer is formed over the high-k dielectric layer. The gate electrode layer is patterned to form a patterned gate electrode layer, the patterned gate electrode -layer having exposed side walls and a top. Sidewall spacers are formed over the exposed side walls of the patterned gate electrode layer, the sidewall spacers having tops. The patterned gate electrode layer is etched to pull the top of the patterned gate electrode layer down from the tops of the sidewall spacers. The exposed portions of the high-k dielectric layer not under the sidewall spacers and the pulled-down patterned gate electrode layer are removed.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
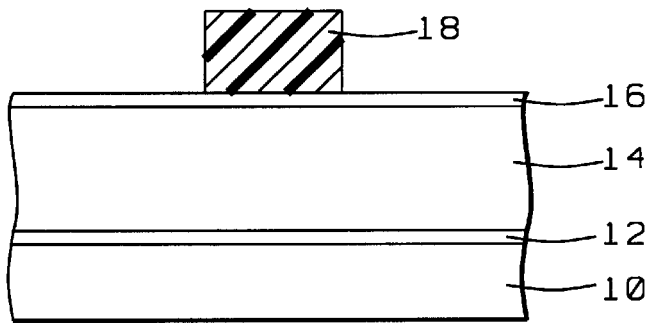
FIGS. 1 to 8 schematically illustrate a preferred embodiment of the present invention.

As shown in FIG. 1, substrate 10 is preferably a semiconductor substrate and is preferably comprised of silicon or germanium and is more preferably comprised of silicon. High-k dielectric layer 12 is formed over substrate 10 to a thickness of preferably from about 5 to 100 Å and more preferably from about 10 to 40 Å. High-k dielectric layer 12 is preferably comprised of $ZrO_2$, $Al_2O_3$, $Y_2O_3$, $HfO_2$, $LaO_2$, $HfSi_xO_y$, or $HfAl_xO_y$ and is more preferably comprised of $ZrO_2$ or $HfO_2$.

Gate electrode material layer 14 is formed over high-k dielectric layer 12 to a thickness of preferably from about 500 to 2500 Å and more preferably from about 1000 to 2000 Å. Gate electrode material layer 14 is preferably formed of polysilicon (poly), silicon germanium ($Si_xGe_{x-1}$) or amorphous silicon and is more preferably polysilicon as will be used for illustrative purposes hereafter.

An optional hard mask layer 16 is formed over poly layer 14 to a thickness of preferably from about 300 to 1500 Å and more preferably from about 500 to 1000 Å. Hard mask layer 16 is preferably comprised of SiN, $SiO_2$ or SiON and is more preferably SiON.

To pattern optional hard mask layer 16 and poly layer 14 a patterned photoresist (PR) layer 18, for example, is formed over hard mask layer 16.

Patterning of Optional Hard Mask Layer 16

Figure 2:
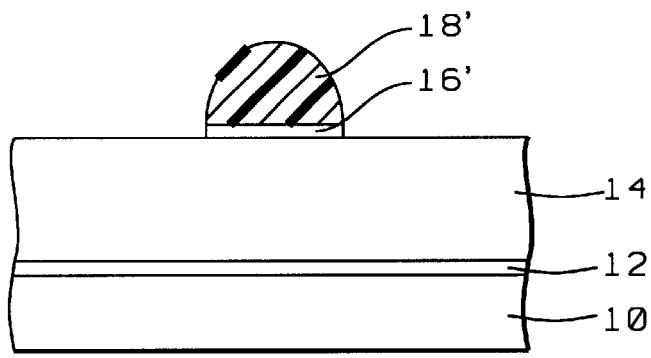

As shown in FIG. 2, hard mask layer 16 is patterned using patterned PR layer 18 as a mask to form patterned hard mask layer 16'.

Patterning of Poly Layer 14

Figure 3:
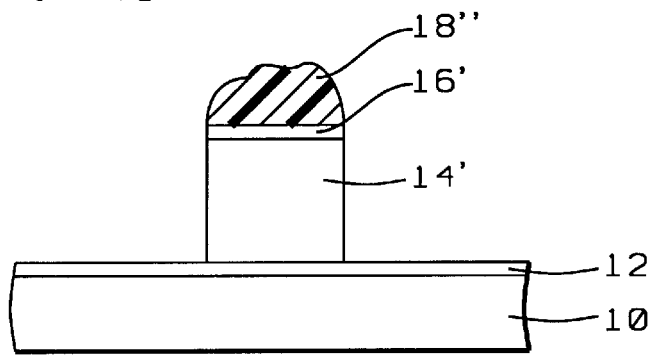

As shown in FIG. 3, poly layer 14 is patterned using patterned hard mask layer 16' (and remaining PR layer 18') as a mask to form patterned poly layer 14'. If optional hard mask layer 16 is not used, then poly layer 14 may be patterned using patterned PR layer 18, for example, as a mask.

Removal of Patterned Hard Mask Layer 16' and Remaining PR Layer 18"

Figure 4:
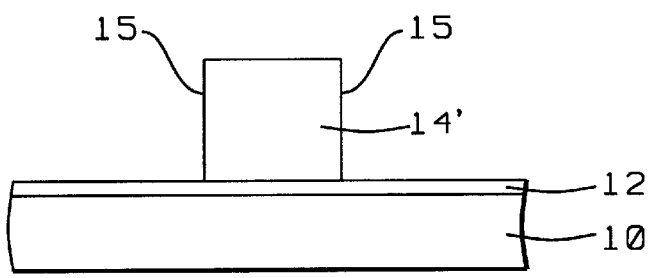

As shown in FIG. 4, patterned hard mask layer 16' and remaining PR layer 18" are removed from patterned poly layer 14' and the structure may be cleaned.

Formation of Sidewall Spacers 20

Figure 5:
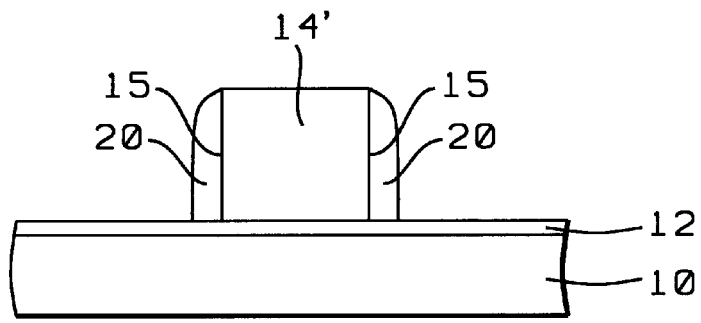

As shown in FIG. 5, sidewall spacers 20 are formed over the exposed side walls 15 of patterned poly layer 14'. Sidewall spacers 20 are preferably from about 200 to 1500 Å wide at their base and are more preferably from about 500 to 1000 Å wide at their base. Sidewall spacers 20 are preferably comprised of $SiO_2$, SiON or $SiO_2$/SiN composite and are more preferably SiN.

Pull-Down of Patterned Poly Layer 14'

Figure 6:
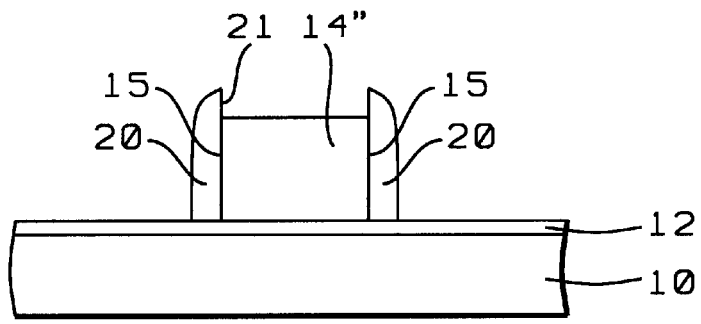

As shown in FIG. 6, patterned poly layer 14' is etched to form a pulled-down patterned poly layer 14" preferably from about 90 to 550 Å and more preferably from about 100 to 500 Å below the top of the sidewall spacers 20 as at 21.

By pulling-down the patterned poly layer 14', the subsequent sputter 40 to remove the exposed high-k dielectric layer 12, which also removes a portion of the sidewall spacers 20, does not expose a portion of the patterned poly layer 14" above the sputtered sidewall spacers 20' and thereby prevents silicide shorting problems.

Sputter 40 to Remove Exposed High-K Dielectric Layer 12

Figure 7:
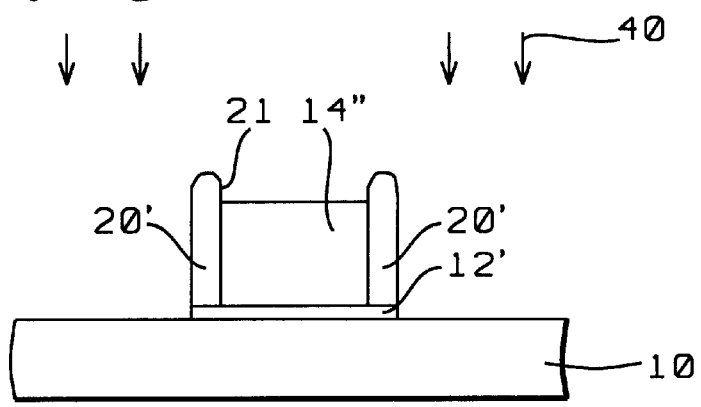

As shown in FIG. 7, the exposed portion of the high-k dielectric layer 12 not under pulled-down poly layer 14" and sidewall spacers 20 is removed using a sputter 40. The sputter 40 is preferably an argon (Ar) sputter, a $C_xF_y$/Ar sputter, a $C_xH_yF_z$/Ar sputter or a $C_xF_yO_2$/Ar sputter and is more preferably an argon (Ar) sputter.

Formation of Optional Silicide Portions 22; 24

Figure 8:
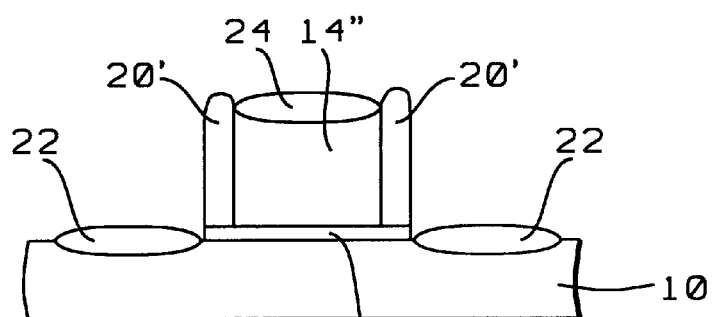

As shown in FIG. 8, optional silicide portions 22 are formed over the exposed substrate 10 adjacent sidewall spacers 20 and an optional silicide portion 24 is formed over the exposed pulled-down patterned poly layer 14". Silicide portions 22; 24 are preferably from about 30 to 400 Å and more preferably from about 50 to 300 Å. Silicide portions 22; 24 are preferably comprised of $Ti_xSi_y$, $Co_xSi_y$, or $Ni_xSi_y$.

While particular embodiments of the present invention have been illustrated and described, it is not intended to limit the invention, except as defined by the following claims.

We claim:

1. A method of patterning a gate electrode layer having an underlying high-k dielectric layer, comprising the sequential steps of:

providing a substrate;

forming a high-k dielectric layer over the substrate;

forming a gate electrode layer over the high-k dielectric layer;

patterning the gate electrode layer to form a patterned gate electrode layer, the patterned gate electrode layer having exposed side walls and a top;

forming sidewall spacers over the exposed side walls of the patterned gate electrode layer, the sidewall spacers having tops;

etching the patterned gate electrode layer to pull the top of the patterned gate electrode layer down from the tops of the sidewall spacers; and removing exposed portions of the high-k dielectric layer not under the sidewall spacers and the pulled-down patterned gate electrode layer.

2. The method of claim 1, wherein the high-k dielectric layer is comprised of a material selected from the group consisting of $ZrO_2$, $Al_2O_3$, $Y_2O_3$, $HfO_2$, $LaO_2$, $HfSi_xO_y$ and $HfAl_xO_y$.

3. The method of claim 1, wherein the high-k dielectric layer is comprised of $ZrO_2$ and $HfO_2$.

4. The method of claim 1, wherein the gate electrode layer is comprised of a material selected from the group consisting of polysilicon, silicon germanium and amorphous silicon.

5. The method of claim 1, wherein the gate electrode layer is comprised of polysilicon.

6. The method of claim 1, wherein the sidewall spacers are comprised of a material selected from the group consisting of $SiO_2$, SiON and $SiO_2$/SiN composite.

7. The method of claim 1, wherein the sidewall spacers are comprised of SiN.

8. The method of claim 1, wherein the removal of the exposed portions of the high-k dielectric layer is by a sputtering process selected from the group consisting of an argon sputter, a $C_xF_y$/Ar sputter, a $C_xH_yF_z$/Ar sputter and a $C_xF_yO_2$/Ar sputter.

9. The method of claim 1, wherein the removal of the exposed portions of the high-k dielectric layer is by an argon sputtering process.

10. The method of claim 1, wherein the high-k dielectric layer has a thickness of from about 5 to 100 Å; the gate electrode layer has a thickness of from about 500 to 2500 Å; and the sidewall spacers have a base width of from about 300 to 1500 Å.

11. The method of claim 1, wherein the high-k dielectric layer has a thickness of from about 10 to 40 Å; the gate electrode layer has a thickness of from about 1000 to 2000 Å; and the sidewall spacers have a base width of from about 500 to 1000 Å.

12. The method of claim 1, wherein the top of the pulled-down patterned gate electrode layer is from about 90 to 550 Å below the tops of the sidewall spacers.

13. The method of claim 1, wherein the top of the pulled-down patterned gate electrode layer is from about 100 to 500 Å below the tops of the sidewall spacers.

14. The method of claim 1, including the step of then forming silicide portions over the exposed portions of the substrate adjacent the sidewall spacers and over the top of the pulled-down patterned gate electrode layer.

15. The method of claim 1, wherein the gate electrode layer is patterned using an overlying patterned hard mask layer.

16. A method of patterning a gate electrode layer having an underlying high-k dielectric layer, comprising the sequential steps of:

providing a substrate;

forming a high-k dielectric layer over the substrate;

forming a gate electrode layer over the high-k dielectric layer;

forming a patterned hard mask layer over the gate electrode layer;

patterning the gate electrode layer using the patterned hard mask layer as a mask to form a patterned gate electrode layer, the patterned gate electrode layer having exposed side walls and a top;

forming sidewall spacers over the exposed side walls of the patterned gate electrode layer, the sidewall spacers having tops;

etching the patterned gate electrode layer to pull the top of the patterned gate electrode layer down from the tops of the sidewall spacers; and sputtering to remove exposed portions of the high-k dielectric layer not under the sidewall spacers and the pulled-down patterned gate electrode layer.

17. The method of claim 16, wherein the high-k dielectric layer is comprised of a material selected from the group consisting of $ZrO_2$, $Al_2O_3$, $Y_2O_3$, $HfO_2$, $LaO_2$, $HfSi_xO_y$ and $HfAl_xO_y$.

18. The method of claim 16, wherein the high-k dielectric layer is comprised of $ZrO_2$ and $HfO_2$.

19. The method of claim 16, wherein the gate electrode layer is comprised of a material selected from the group consisting of polysilicon, silicon germanium and amorphous silicon.

20. The method of claim 16, wherein the gate electrode layer is comprised of polysilicon.

21. The method of claim 16, wherein the sidewall spacers are comprised of a material selected from the group consisting of $SiO_2$, SiON and $SiO_2$/SiN composite.

22. The method of claim 16, wherein the sidewall spacers are comprised of SiN.

23. The method of claim 16, wherein the patterned hard mask layer is comprised of a material selected from the group consisting of SiN, $SiO_2$ and SiON.

24. The method of claim 16, wherein the patterned hard mask layer is comprised of SiON.

25. The method of claim 16, wherein the removal of the exposed portions of the high-k dielectric layer by sputtering uses a sputtering selected from the group consisting of an argon sputter, a $C_xF_y$/Ar sputter, a $C_xH_yF_z$/Ar sputter and a $C_xF_yO_2$/Ar sputter.

26. The method of claim 16, wherein the removal of the exposed portions of the high-k dielectric layer by sputtering uses an argon sputtering.

27. The method of claim 16, wherein the high-k dielectric layer has a thickness of from about 5 to 100 Å; the gate electrode layer has a thickness of from about 500 to 2500 Å; and the sidewall spacers have a base width of from about 300 to 1500 Å.

28. The method of claim 16, wherein the high-k dielectric layer has a thickness of from about 10 to 40 Å; the gate electrode layer has a thickness of from about 1000 to 2000 Å; and the sidewall spacers have a base width of from about 500 to 1000 Å.

29. The method of claim 16, wherein the patterned hard mask layer has a thickness of from about 300 to 1500 Å.

30. The method of claim 16, wherein the patterned hard mask layer has a thickness of from about 500 to 1000 Å.

31. The method of claim 16, wherein the top of the pulled-down patterned gate electrode layer is from about 90 to 550 Å below the tops of the sidewall spacers.

32. The method of claim 16, wherein the top of the pulled-down patterned gate electrode layer is from about 100 to 500 Å below the tops of the sidewall spacers.

33. The method of claim 16, including the step of then forming silicide portions over the exposed portions of the substrate adjacent the sidewall spacers and over the top of the pulled-down patterned gate electrode layer.

34. A method of patterning a gate electrode layer having an underlying high-k dielectric layer, comprising the sequential steps of:

providing a substrate;

forming a high-k dielectric layer over the substrate;

forming a gate electrode layer over the high-k dielectric layer;

forming a patterned hard mask layer over the gate electrode layer;

patterning the gate electrode layer using the patterned hard mask layer as a mask to form a patterned gate electrode layer, the patterned gate electrode layer having exposed side walls and a top;

forming sidewall spacers over the exposed side walls of the patterned gate electrode layer; the sidewall spacers having tops;

etching the patterned gate electrode layer to pull the top of the patterned gate electrode layer down from the tops of the sidewall spacers;

sputtering to remove exposed portions of the high-k dielectric layer not under the sidewall spacers and the pulled-down patterned gate electrode layer; and forming silicide portions over the exposed portions of the substrate adjacent the sidewall spacers and over the top of the pulled-down patterned gate electrode layer.

35. The method of claim 34, wherein the high-k dielectric layer is comprised of a material selected from the group consisting of $ZrO_2$, $Al_2O_3$, $Y_2O_3$, $HfO_2$, $LaO_2$, $HfSi_xO_y$ and $HfAl_xO_y$.

36. The method of claim 34, wherein the high-k dielectric layer is comprised of $ZrO_2$ and $HfO_2$.

37. The method of claim 34, wherein the gate electrode layer is comprised of a material selected from the group consisting of polysilicon, silicon germanium and amorphous silicon.

38. The method of claim 34, wherein the gate electrode layer is comprised of polysilicon.

39. The method of claim 34, wherein the sidewall spacers are comprised of a material selected from the group consisting of $SiO_2$, SiON and $SiO_2$/SiN composite.

40. The method of claim 34, wherein the sidewall spacers are comprised of SiN.

41. The method of claim 34, wherein the patterned hard mask layer is comprised of a material selected from the group consisting of SiN, $SiO_2$ and SiON.

42. The method of claim 34, wherein the patterned hard mask layer is comprised of SiON.

43. The method of claim 34, wherein the removal of the exposed portions of the high-k dielectric layer by sputtering uses a sputtering selected from the group consisting of an argon sputter, a $C_xF_y$/Ar sputter, a $C_xH_yF_z$/Ar sputter and a $C_xF_yO_2$/Ar sputter.

44. The method of claim 34, wherein the removal of the exposed portions of the high-k dielectric layer by sputtering uses an argon sputtering.

45. The method of claim 34, wherein the high-k dielectric layer has a thickness of from about 5 to 10 Å; the gate electrode layer has a thickness of from about 500 to 2500 Å; and the sidewall spacers have a base width of from about 300 to 1500 Å.

46. The method of claim 34, wherein the high-k dielectric layer has a thickness of from about 10 to 40 Å; the gate electrode layer has a thickness of from about 1000 to 2000 Å; and the sidewall spacers have a base width of from about 500 to 1000 Å.

47. The method of claim 34, wherein the patterned hard mask layer has a thickness of from about 300 to 1500 Å.

48. The method of claim 34, wherein the patterned hard mask layer has a thickness of from about 500 to 1000 Å.

49. The method of claim 34, wherein the top of the pulled-down patterned gate electrode layer is from about 90 to 550 Å below the tops of the sidewall spacers.

50. The method of claim 34, wherein the top of the pulled-down patterned gate electrode layer is from about 100 to 500 Å below the tops of the sidewall spacers.

* * * * *